United States Patent
Espejord et al.

(10) Patent No.: US 10,852,224 B2
(45) Date of Patent: Dec. 1, 2020

(54) METHOD OF MEASURING METAL LOSS FROM EQUIPMENT IN PROCESS SYSTEMS

(71) Applicant: ROXAR FLOW MEASUREMENT AS, Stavanger (NO)

(72) Inventors: Olav Espejord, Trondheim (NO); Cristian Mihai Iorga, Stjørdal (NO)

(73) Assignee: Roxar Flow Measurement AS, Stavanger (NO)

(*) Notice: Subject to any disclaimer, the term of this patent is extended or adjusted under 35 U.S.C. 154(b) by 355 days.

(21) Appl. No.: 15/736,077

(22) PCT Filed: Jun. 15, 2016

(86) PCT No.: PCT/NO2016/050128
§ 371 (c)(1),
(2) Date: Dec. 13, 2017

(87) PCT Pub. No.: WO2016/204625
PCT Pub. Date: Dec. 22, 2016

(65) Prior Publication Data
US 2018/0172577 A1  Jun. 21, 2018

(30) Foreign Application Priority Data

Jun. 17, 2015 (NO) .................................. 20150799

(51) Int. Cl.
*G01B 7/06* (2006.01)
*G01N 17/00* (2006.01)
(Continued)

(52) U.S. Cl.
CPC .............. *G01N 17/04* (2013.01); *G01B 7/06* (2013.01); *G01N 17/006* (2013.01); *G01N 27/041* (2013.01); *G01R 27/02* (2013.01)

(58) Field of Classification Search
CPC .... G01N 17/04; G01N 17/006; G01N 17/041; G01N 27/9046; G01R 27/02; G01B 7/06; G05B 23/0254

(Continued)

(56) References Cited

U.S. PATENT DOCUMENTS 5,293,323 A  3/1994 Doskocil et al.
6,919,729 B2  7/2005 Tiefnig
(Continued)

FOREIGN PATENT DOCUMENTS

GB  2 150 300 A * 6/1985 ............. G01N 17/00
GB  2150300 A   6/1985

OTHER PUBLICATIONS

International Search Report and Written Opinion in corresponding PCT Application No. PCT/NO2016/050128 dated Nov. 22, 2016.

*Primary Examiner* — Alexander Satanovsky
*Assistant Examiner* — Jeffrey P Aiello
(74) *Attorney, Agent, or Firm* — Alix, Yale & Ristas, LLP

(57) ABSTRACT

Method of measuring metal loss from equipment in process systems. Probes installed for monitoring one or both of erosion and corrosion (metal loss) in process equipment use results from resistivity measurements in a measurement element and a reference element to produce a measurement of metal loss in the measurement element exposed to process flow and may trigger an alarm when measured metal loss exceeds a threshold level. Prior art methods produce numerous false alarms hiding true alarms. The present method ignores these false alarms that are common in known methods by calculating confidence measures that are included in the metal loss calculations to attenuate noise that otherwise would produce false alarms or misinterpretation of the corrosion or erosion state in the process equipment being monitored.

11 Claims, 3 Drawing Sheets

(51) Int. Cl.
*G01N 17/04* (2006.01)
*G01N 27/04* (2006.01)
*G01R 27/02* (2006.01)

(58) Field of Classification Search
USPC ..... 324/229, 326, 700; 340/540, 679, 853.1; 702/1, 3–35, 181–185, 189
See application file for complete search history.

(56) References Cited

U.S. PATENT DOCUMENTS

| | | | |
|---|---|---|---|
| 2002/0006667 A1* | 1/2002 | Chimenti | G01N 33/2876 436/60 |
| 2005/0079378 A1* | 4/2005 | Lundberg | B32B 15/01 428/674 |
| 2007/0019898 A1* | 1/2007 | Chimenti | G01L 1/246 385/12 |
| 2007/0199379 A1* | 8/2007 | Wolf | G01N 17/04 73/590 |
| 2008/0141780 A1 | 6/2008 | Wavering et al. | |
| 2008/0314150 A1* | 12/2008 | Wolf | G01N 17/04 73/579 |
| 2010/0275689 A1* | 11/2010 | Wolf | G01N 17/04 73/579 |
| 2011/0196621 A1 | 8/2011 | Huyse et al. | |
| 2012/0181179 A1* | 7/2012 | Zaytsev | B23H 3/02 205/81 |
| 2012/0235693 A1* | 9/2012 | Feng | G01N 27/20 324/693 |
| 2013/0050896 A1* | 2/2013 | Park | H01G 4/12 361/321.1 |
| 2015/0106036 A1 | 4/2015 | Kumaran et al. | |

* cited by examiner

METHOD OF MEASURING METAL LOSS FROM EQUIPMENT IN PROCESS SYSTEMS

CROSS-REFERENCE TO RELATED PATENT APPLICATIONS

This application is a U.S. National Phase Application under 35 U.S.C. § 371 of International Patent Application No. PCT/NO2016/050128, filed Jun. 15, 2016, and claims the priority of NO 20150799, filed Jun. 17, 2015, all of which are incorporated by reference in their entireties. The International Application was published on Dec. 22, 2016 as International Publication No. WO 2016/204625 A1.

The present invention is related to a method of measuring metal loss from equipment in process systems in accordance with the preamble of patent claim 1.

BACKGROUND

Erosion in process equipment such as valves and pipe fittings is a severe problem in certain types of processes. This is particularly the case for process flows that contain sand in suspension in a fluid flow, where erosion is unavoidable. Another cause of metal loss is corrosion.

Usually, erosion and corrosion is detected by measuring change in electrical resistance in an element that is exposed to the process flow within a pipe. As the element becomes thinner because of erosion or corrosion, the electrical resistance increases and gives an indication of the degree of erosion and/or corrosion. Sand probes are one type of sensors which are used in process systems to monitor erosion and comprise a sacrificial element/measurement element arranged in e.g. a process flow line in a subsea well integral with pressure tight assembly arranged in a pipe wall. When the erosion in the measurement element in a sand probe, or a corrosion probe, reaches a predetermined limit or indicates increased development, an alarm may be triggered about action to be taken. For example in an oil well, metal loss caused by sand production may necessitate reduction of production rate to avoid damage to process equipment or even collapse in the well. In another case, a corrosion probe may provide information at an early point in time about increasing corrosion in the process equipment.

Unfortunately, the electrical resistance is heavily dependent on temperature, and in order to compensate for temperature variations, electrical resistance is measured on another element that is not exposed to process flow and hence not subject to erosion and/or corrosion. The latter element is called the reference element and the real erosion/corrosion measurement is the resistivity ratio between the two elements. The reference element is typically constructed of the same material as the measurement element and exhibits the same dimensions. The ratio between the respective resistivity values measured will represent a value for the metal loss in accordance with the following formula:

$$\Delta h_e = h_e - h_r \cdot (R_r/R_e) \qquad (1)$$

where $\Delta h_e$ represents element metal loss, $h_e$ represents the height or thickness of the original measuring element, $h_r$ represents thickness/height of original reference element, $R_r$ represents the resistance in the reference element and $R_e$ represents the resistance in the measuring element. Accordingly, when the ratio between the respective resistivity values changes, the theoretical metal loss also changes, which can be used as an input in a system for generating an alarm which indicates an increased or critical erosion level in the process equipment.

However, the reference element cannot be located at the same place as the measurement element and as a result the reference element cannot follow the accurate same temperature variations as the measurement element and will typically lag behind the latter. Accordingly, as the term "theoretical metal loss" stated above indicates, the real systems behave differently. For example different changes in temperature between the measurement element and reference element may occur, e.g. during process start up, that may produce false metal loss or even metal "gain".

A system for measuring corrosion rate from a fluid medium is described in U.S. Pat. No. 6,919,729 (Rohrback Cosasco Systems). The patent suggests a current feedback amplifier to maintain a constant AC voltage across the reference element to keep the corrosivity measurement independent of the probe's ambient temperature. In other words, the system provides corrosion measurements which are unaffected by noise in the form of resistivity variations caused by changes in temperature.

Another example from the prior art is an electrical resistance corrosion probe described in GB 2 150 300.

However, a temperature compensated measurement of resistivity in a sand probe is not sufficient to obtain reliable values of corrosion level. The resistivity measurements will also be affected by changes in the production regime, e.g. during shutdown and start-up of production in a subsea well where the sacrificing element can heat up differently from the reference element. Another contribution to unreliable measurements and hence false alarms about corrosion threshold are hits on the elements by items in the process flow, electromagnetic interference, faulty elements/probes. As a result, sand probes and corrosion probes may still produce numerous false alarms which hide a real alarm about a threshold corrosion level which may cause damage on and/or failure in the process equipment and process operation.

U.S. Pat. No. 5,293,323 describes a method for enabling a diagnostic system to assess the health of a host system during operation and to detect and isolate system faults with reduced potential for false alarms. Confidence is calculated from numerous tests. The method is not specifically related to corrosion monitoring, and the confidence is calculated from tests by use of numerous additional physical components, and not from real measurements taken during operation by the corrosion probe itself from one single location, as is the case with the present invention.

OBJECT

The main objective of the present invention is to provide a method of detecting erosion and/or corrosion in process equipment which is able to ignore false alarms while allowing detection of a true alarm when a threshold erosion level has been reached.

THE INVENTION

The object above is obtained by a method in accordance with the characterizing part of patent claim 1. Further advantageous features appear from the dependent claims.

Definitions

The term "resistivity change" as used herein, is intended to include resistivity change between a specific point in time (present value, t) and either a previous point in time (t−1) or an average value (a) for the resistivity for the reference element or the measurement element(s). The term "relative resistivity change" is the relative change in resistivity between the measurement element(s) on one hand and the reference element on the other hand. It should be noted that the point in time t−1 can be a point in time before the point in time t and hence not necessarily after the point in time t.

The term "noise limit" or "noise threshold" as used herein, means an absolute value of a resistance jump above which there is no confidence. In other words, values above this noise limit are resistance changes caused by happenings in the process and not by metal loss in the measurement element. The noise limit is denoted as "L".

The term "confidence" as used herein, is intended to provide a value for how reliable a change in resistivity is. Low confidence indicates that a value for a resistivity change is caused by noise and not by true metal loss. On the other hand, high confidence indicates that a value for a resistivity change is caused by true metal loss and not by noise. A confidence measure varies stepless from absolutely no reliability to absolutely full reliability.

The term "alarm" as used herein, is intended to include alarms as used in traditional processing industry. The term is also intended to include a state of change that gives an early warning about material changes that necessarily not would require any action to be taken at that point in time, but predicts a state of change that needs attention and evaluation.

The terms "process" and "process systems" as used herein, are intended to include any process that includes equipment that is subjected to erosive and/or corrosive fluids, e.g. chemical plants, equipment arranged in connection with onshore oil wells as well as subsea oil fields.

SUMMARY OF THE INVENTION

The invention concerns a method of measuring metal loss from equipment in process systems in contact with erosive and/or corrosive process fluids, including pipelines and fittings in gas and oil wells exposed to fluids flowing from downhole formations, wherein the method comprises the steps of:
  a) providing a monitoring probe in contact with the process fluids, said probe comprising one or more measurement elements exposed to the flow of the process fluids, and a reference element protected from flow of the process fluids,
  b) measuring electrical resistance $R_e$ across said one or more measurement element,
  c) measuring electrical resistance $R_r$ across the reference element,
  d) calculating the metal loss $\Delta h_e$ from the resistivity measured in accordance with the formula $$\Delta h_e = h_e - h_r \cdot (R_r/R_e) \quad (1)$$

where $\Delta h_e$, $R_r$ and $R_e$ are as defined above and $h_e$ and $h_r$ represents the original height/thickness of said at least one measurement element and the reference element, respectively.

According to the present invention, the method further comprises the steps of:
  e) providing a confidence measure of the change in resistivity observed by calculating the stability of the reference element resistance value or stability of temperature of the probe measured by an additional temperature sensor, and
  f) applying the confidence measure from step e) in a comparison of resistivity changes as a function of time, to provide a trustworthy value for real metal loss in said one or more measurement elements, thus attenuating resistivity changes caused by noise in the process system, and attenuating resistivity changes to a higher degree when the confidence measure is low and attenuating resistivity changes to a lower degree when the confidence measure is high.

It should be noted that the formula (1) above is just an example of how metal loss is provided by the prior art.

The confidence measure provided in step e) is a measure that is affected by noise, e.g. from changes in temperature and pressure during shut-in of an oil well. In systems with a high noise level, substantial parts of the relative resistivity changes are unreliable and hence the confidence value is low. In other words, the confidence value is a measure of how reliable the change in resistivity is. For example, during stable pressure and temperature conditions, the reference element is expected to exhibit stable resistivity over time (little or no change). When the resistivity in the reference element changes, the reason is caused by changes in the system as indicated above. In the latter case, the resistivity change measurements for both the reference element and the measurement element(s) must to a greater extent be filtered to reject transitory changes which are not caused by metal loss in the probe but from changes in operating conditions.

The trustworthy value for real metal loss provided in step f) may be used to encourage an observer to take some sort of action, e.g. to trigger an alarm or take preventive action, if its value exceeds a predetermined threshold value or shows unexpected or unwanted development.

The confidence measure can be provided in numerous ways. In one embodiment the confidence measure in step e) is calculated in accordance with formula (2):

$$\text{confidence} = (L - \text{Abs}(R_t - R_a))/L \quad (2)$$

where confidence represents calculated confidence with decimal values from ranging from 0 to 1, where the value 0 represents no or low confidence, and the value 1 represents high confidence, $R_t$ represents the latest reference resistance value from a selected range of measurements, $R_a$ represents a weighted average of resistance samples taken at previous points in time, and L represents the noise limit, a measure of a expected noise under stable operating conditions. In systems with little noise, the value of L is low, and to the contrary the value of L is high in systems with a high noise level. In other words, a confidence value of 1 represents a 100% reliable measurement of resistivity change, whereas a confidence value of 0 represents 0% reliable measurement of resistivity change. However, the confidence must be calibrated for the specific system and weighted against a noise threshold.

The trustworthy value for real metal loss may be calculated in numerous ways, but in one embodiment its value provided in step f) is calculated in accordance with formula (3):

$$Y_t = X_t \cdot \text{confidence} + Y_{t-1} \cdot (1 - \text{confidence}) \quad (3)$$

where the output value $Y_t$ is filtered resistance ratio between the measurement element and the reference element at a point in time t. The output value represents trusted metal loss. The input value $X_t$ is unfiltered resistance ratio between the measurement element and the reference element at a point in time t. The input value represents untrusted metal loss. The input value $Y_{t-1}$ represents filtered resistance ratio between the measurement element and the reference element at a previous point in time t−1. The input value confidence represents the confidence measure from step e). The time difference between observed resistivity taken at time "t" and "t−1" may vary. For example, for sand probes the time difference may typically have an order of magnitude of minute or minutes, whereas corrosion probes are operated with time intervals of hours or even days.

It should be noted that the calculation of the trustworthy value (filtering) for real metal loss in equation (3) above, also can be applied on resistance values for the reference element and on resistance values for the measurement element separately. Then, the resulting filtered resistance values are used to calculate a filtered ratio between the respective filtered resistance measurements, instead of from filtered resistance ratios as set forth in the preceding paragraphs.

Accordingly, step f) can be performed as follows: calculating a (filtered) trustworthy value for real metal loss in accordance with formula (3):

$$Y_t = X_t \cdot \text{confidence} + Y_{t-1} \cdot (1-\text{confidence}) \quad (3)$$

where the calculated output value $Y_t$ is a filtered resistance measurement of the measurement element at a point in time t, representing trusted metal loss, the input value $X_t$ is unfiltered resistance measurement of the measurement element at a point in time t, representing untrusted metal loss, the input value $Y_{t-1}$ represents calculated filtered resistance measurement of the measurement element at a previous point in time t−1, said input value confidence representing the confidence measure calculated in step e), repeating the calculation above, where $X_t$ represents unfiltered resistance measurement for the reference element, $Y_{t-1}$ represents calculated filtered resistance for the reference element at a previous point in time t−1, wherein the input value confidence is as defined above, and then calculating the ratio between respective calculated filtered resistance values $Y_t$ at selected points in time t.

Temperature compensation is advantageously applied at some stage during the calculation process to attenuate noise caused by temperature variations during the measurement period. Applying temperature compensation should be within the reach of a person skilled in the art and is not described in further detail here.

To summarize, the present method has shown to suppress up to 99% of false alarms while retaining 100% of the true alarms by applying the method on data sets from real subsea wells. I other words the method of the present invention ignores false alarms by calculating a confidence value (measure) of the measured changes in resistivity during a certain period of time.

DRAWINGS

The invention is described below in further details by means of an example applying real resistivity measurements from a real subsea well and by means of drawings, where FIG. 1 shows a plot of relative resistivity; both filtered and unfiltered taken over a certain period of time, FIG. 2 is a block diagram that illustrates one example of an embodiment of the method in accordance with the present invention in the form of filtering noise and calculating confidence values for measured resistivity ratio, and FIG. 3 is a figure similar to FIG. 1, showing another exemplary embodiment of how to deploy the method of the present invention.

EXAMPLE

The example described below is provided to describe one embodiment of the method of the present invention. In further detail, resistivity measurements from sand probe installations in a real subsea well in the Norwegian Sea were used to calculate trustworthy (filtered) changes in resistivity ratios which enabled detection of real metal loss and at the same time ignoring false indications of metal loss provided by changes in resistivity ratio.

TABLE 1

| Sample number | Unfiltered measurement element resistance | Unfiltered reference element resistance | Unfiltered ratio | Filtered ratio |
|---|---|---|---|---|
| 5270 | 0.015213815 | 0.01443745 | 1.05377449 | 1.053852 |
| 5271 | 0.015210943 | 0.01443801 | 1.05353443 | 1.053715 |
| 5272 | 0.015213096 | 0.01443702 | 1.05375618 | 1.053732 |
| 5273 | 0.015210225 | 0.01443654 | 1.05359214 | 1.053675 |
| 5274 | 0.0152137 | 0.01443657 | 1.05383045 | 1.053747 |
| 5275 | 0.015216318 | 0.01443591 | 1.05406031 | 1.05388 |
| 5276 | 0.015210754 | 0.01443757 | 1.05355362 | 1.053723 |
| 5277 | 0.015210677 | 0.01443539 | 1.05370725 | 1.053717 |
| 5278 | 0.015210349 | 0.01443808 | 1.05348816 | 1.053617 |
| 5279 | 0.015214076 | 0.01443887 | 1.05368892 | 1.053643 |
| 5280 | 0.015211896 | 0.01443889 | 1.05353617 | 1.053598 |
| 5281 | 0.015170436 | 0.01439668 | 1.05374535 | 1.053603 |
| 5282 | 0.015190904 | 0.01441449 | 1.05386378 | 1.053637 |
| 5283 | 0.01518785 | 0.01441478 | 1.05363054 | 1.053635 |
| 5284 | 0.015092505 | 0.0143309 | 1.05314394 | 1.053622 |
| 5285 | 0.015030649 | 0.01426469 | 1.05369613 | 1.053631 |
| 5286 | 0.0152099 | 0.0144321 | 1.05389348 | 1.053646 |
| 5287 | 0.015228192 | 0.01444705 | 1.05406969 | 1.053709 |
| 5288 | 0.015225774 | 0.01444663 | 1.05393268 | 1.053732 |
| 5289 | 0.015206368 | 0.01443498 | 1.05343865 | 1.053675 |
| 5290 | 0.015218641 | 0.01444019 | 1.05390888 | 1.053739 |
| 5291 | 0.015215305 | 0.01444235 | 1.05352022 | 1.053681 |
| 5292 | 0.015219591 | 0.01444038 | 1.05396039 | 1.053776 |
| 5293 | 0.015216938 | 0.01444245 | 1.05362578 | 1.053715 |
| 5294 | 0.015215776 | 0.01444193 | 1.05358294 | 1.053654 |
| 5295 | 0.015219602 | 0.01444369 | 1.05372001 | 1.053688 |
| 5296 | 0.015219434 | 0.01444311 | 1.05375051 | 1.053723 |
| 5297 | 0.015218635 | 0.01444185 | 1.05378704 | 1.053762 |
| 5298 | 0.015222493 | 0.01444067 | 1.05414048 | 1.054008 |
| 5299 | 0.01522616 | 0.01444164 | 1.05432365 | 1.054224 |
| 5300 | 0.015228103 | 0.01444117 | 1.05449215 | 1.054416 |
| 5301 | 0.015232788 | 0.01444014 | 1.05489168 | 1.05477 |
| 5302 | 0.0152305 | 0.01444339 | 1.05449611 | 1.05458 |
| 5303 | 0.015233966 | 0.01443906 | 1.05505268 | 1.054906 |
| 5304 | 0.015230507 | 0.01444025 | 1.05472589 | 1.054776 |
| 5305 | 0.015229926 | 0.01444013 | 1.05469451 | 1.054715 |
| 5306 | 0.015226683 | 0.01444005 | 1.05447553 | 1.05453 |
| 5307 | 0.01523411 | 0.01443914 | 1.05505638 | 1.054949 |
| 5308 | 0.015231647 | 0.01443939 | 1.05486762 | 1.054883 |
| 5309 | 0.015233433 | 0.01443901 | 1.05501954 | 1.054997 |
| 5310 | 0.015227948 | 0.01443614 | 1.05484918 | 1.054907 |

Table 1 above illustrates measurements with their unfiltered and filtered ratio (ratio is measurement element resistance divided by reference element resistance). The filtered resistances used to compute the filtered ratio are not shown. The data is taken from a set of erosion measurements where a few temperature variations are followed by a legitimate step in erosion.

Now referring to FIG. 1, the uppermost curve indicated at 11 represents resistance measurements as a function of time (left axis). Resistance measurements from the reference element as a function of time is shown in the curve below, indicated at reference numeral 12 (left axis). At reference numeral 13, the unfiltered ratio (right axis) between the two abovementioned resistance measurements is shown as a function of time. As is evident from the diagram, a resistance jump has been detected in the time interval from about 5283 to about 5288. This resistance jump does not represent any real metal loss and is a result of noise in the process system. As a result, an observer might take unnecessary action, e.g. reduced production to decrease or prevent erosion in process equipment or prevent formation collapse from sand production in an oil well. A filtered ratio provided by the method of the present invention (right axis) is indicated at reference numeral 14. Here, the resistance jump in the time interval from about 5283 to about 5288 has been attenuated by the use of the confidence measure in the calculation of the (filtered) ratio. Accordingly, the filtered ratio does not, correctly, indicate any metal loss in the time interval mentioned above, and an observer is not encouraged to take any unnecessary action. The result is enhanced up-time and cost savings, for example in view of prevented shutdown or maintained production rate.

However, at sample number 5298 there is a significant increase in both the unfiltered and filtered resistance ratios, and the resistance ratios are from that point in time substantially congruent. This resistance ratio jump represents a true metal loss which tells the observer that some sort of action should be taken.

Accordingly, the method in accordance with the present invention successfully suppresses temperature noise while admitting legitimate data caused by real material changes in the form of corrosion and/or erosion.

Figure 1:
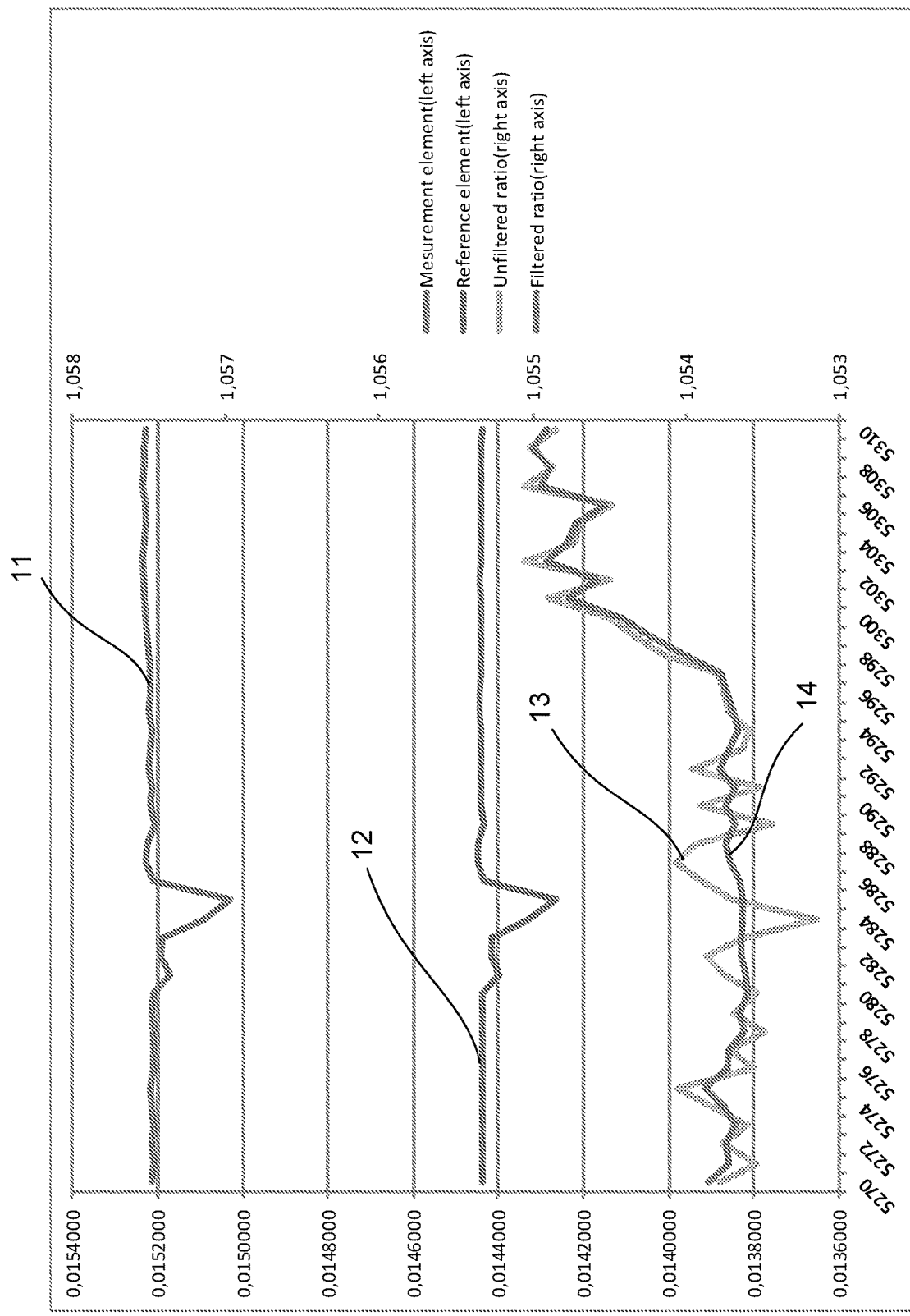
Figure 2:
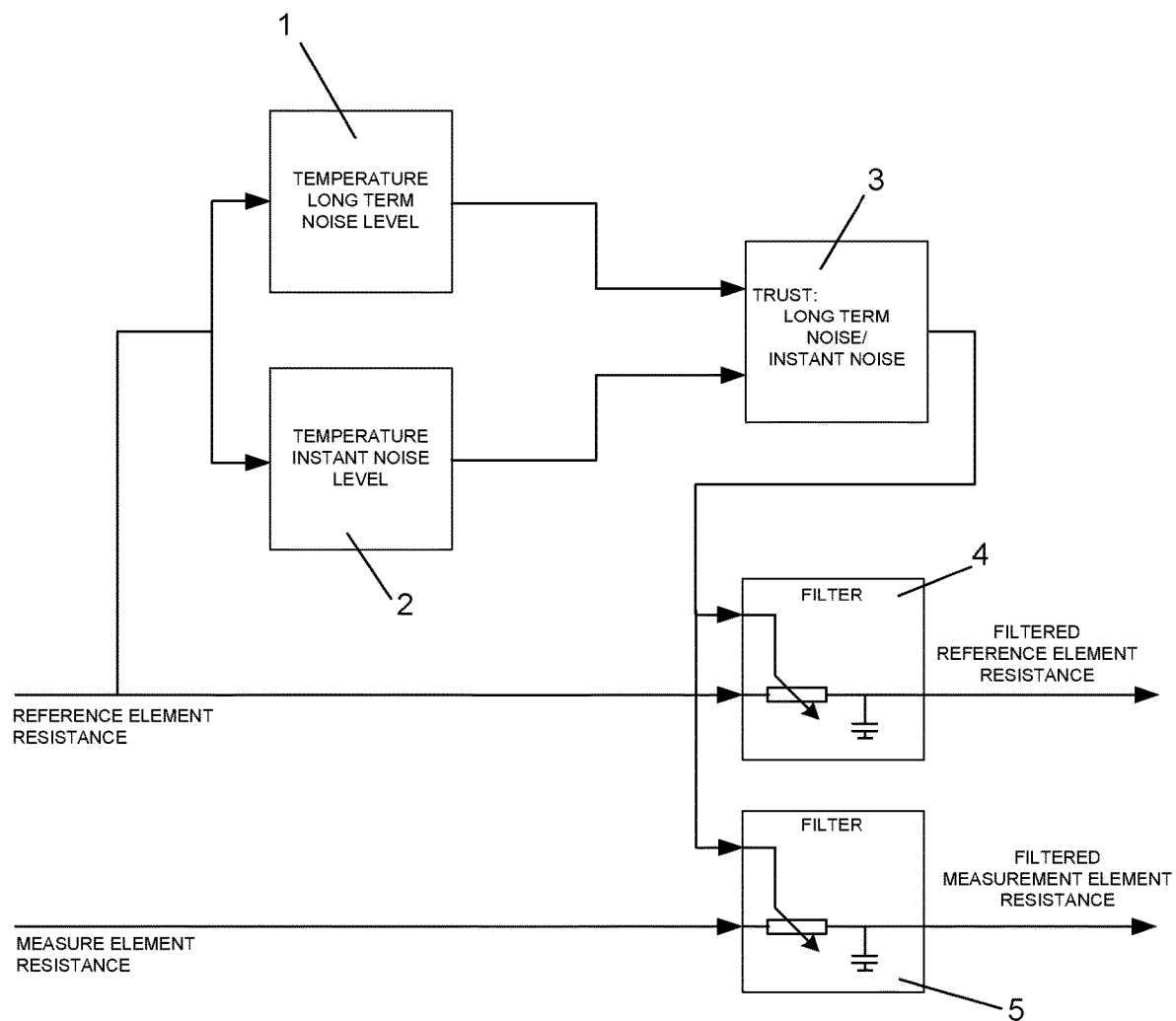
FIG. 2 shows a block diagram of a device for implementation of the method described above, in a sand probe comprising a measurement element and a reference element arranged within the process flow of, e.g., a pipeline.

As can be seen from FIG. 2, the temperature long term noise level L is computed in step 1, whereas the temperature instant noise level is provided in step 2. The long term noise level may in its simplest form be represented by the noise floor of the instrument itself. However, this will not provide a good result in a pipe where the temperature is noisy in normal operation. Therefore, some calculation should be performed in order to determine the normal noise. The instant noise level is the absolute value of the high pass filtered temperature. The respective values are used to calculate confidence in step 3 in the figure, and in accordance with equation 2 above. Step 3 in the figures corresponds to step e) in the method according to the present method. The calculated confidence is used as input values in step 4 and 5 to calculate filtered resistance values for the reference element and the measurement element, respectively, which again are used as input values to calculate trusted metal loss (step f) of the method according to the present invention), which enabled suppression of about 99% of false alarms produced by prior art methods while retaining 100% of the true alarms indicating detrimental corrosion or erosion in the process equipment being monitored.

Figure 3:
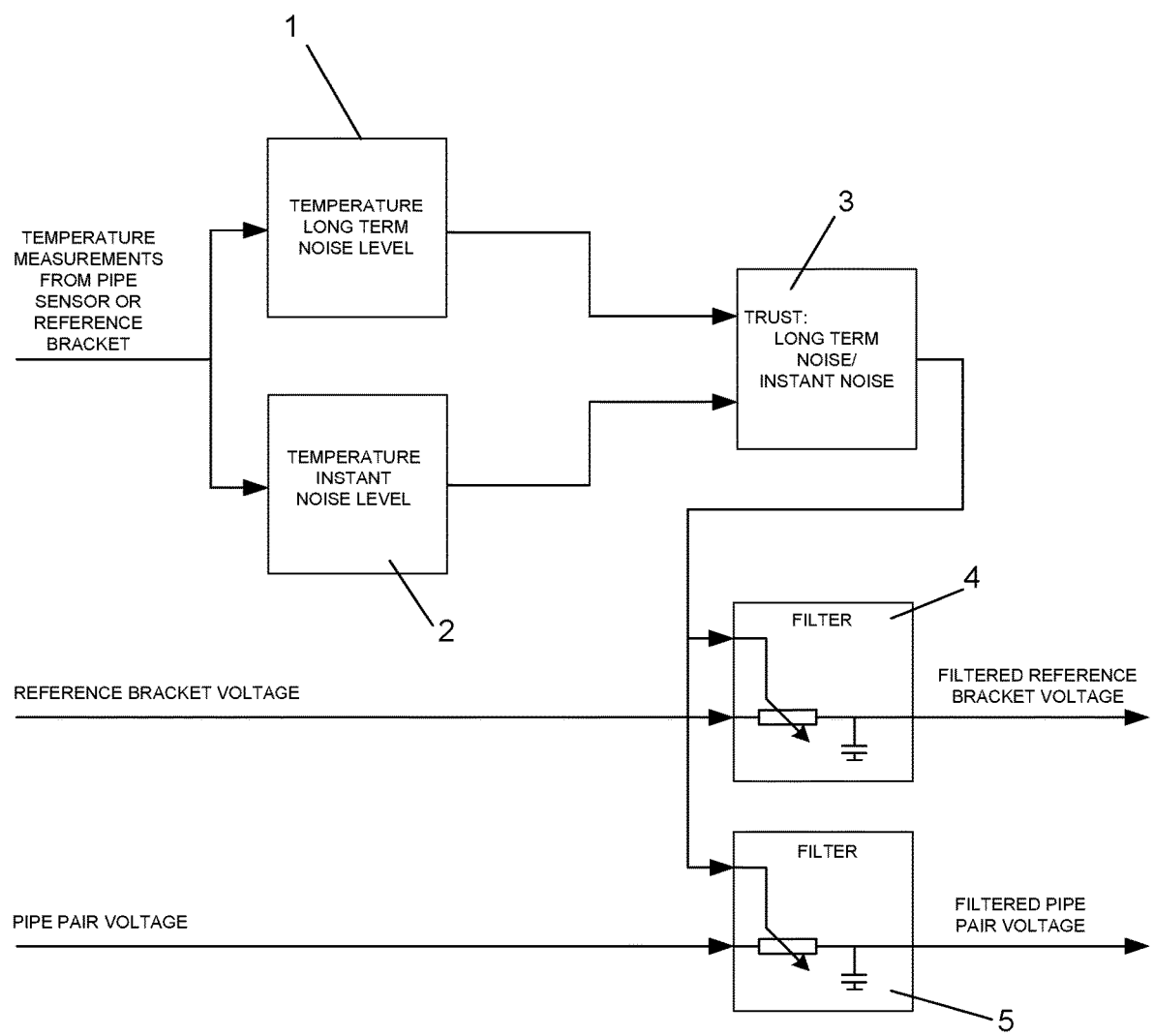
FIG. 3 is a drawing similar to FIG. 2 but where the reference element is implemented as the pipeline itself.

FIG. 3 illustrates another embodiment of the present invention applied in the applicant's Field Signature (FSM) method. Here the measurement element is the pipe wall itself whereas the reference element may be a bracket attached to the outer surface of the pipe, where the bracket comprises an array of non-intrusive sensing pins distributed over the area to be monitored. Here the time lag is even greater and the risk of false alarms even higher. The input to step 1 and 2 is temperature measurements from process equipment, e.g. a pipe temperature sensor or a reference bracket temperature sensor.

Accordingly, the present invention discloses a novel method of monitoring corrosion and/or erosion in process equipment with a reliability which has been unavailable with prior art solutions. Moreover, a confidence measure can be provided by executing an algorithm on real measurements, without using additional physical components or test sequences as suggested by some prior art.

The method in accordance with the invention can increase time between maintenance, with higher process throughput and increased profit as a result. The present invention may also avoid shutdowns and even accidents caused by a failure from metal loss in process equipment, where the operator has decided to ignore alarms that have been proven to be false, whereupon real alarms also are being ignored. In subsea oil well applications, the present method may detect sand production at an early point in time and allow reduction of production rate to prevent collapse of the formation.

The invention claimed is:

1. Method of measuring metal loss from equipment in process systems in contact with erosive and/or corrosive process fluids, including pipelines and fittings in gas and oil wells exposed to fluids flowing from downhole formations, wherein the method comprises the steps of:
   a) providing a monitoring probe in contact with the process fluids, said probe comprising one or more measurement elements exposed to the flow of the process fluids, and a reference element protected from flow of the process fluids,
   b) measuring electrical resistance e across said one or more measurement elements,
   c) measuring electrical resistance Re across the reference element,
   d) calculating the metal loss $\Delta h_e$ from the resistivity measured in accordance with the formula $$\Delta h_e = h_e - h_r \cdot (R_r / R_e) \qquad (1),$$

where $\Delta h_e$, $R_r$ and $R_e$ are as defined above and $h_e$ and $h_r$ represents the original thickness of said at least one measurement element and the reference element, respectively, characterized in
   e) providing a confidence measure of change in resistivity observed, by calculating the stability of the reference element resistance value or stability of temperature of the probe measured by an additional temperature sensor,
   f) applying the confidence measure from step e) in a comparison of resistivity changes as a function of time, to provide a trustworthy value for real metal loss in said one or more measurement elements, thus attenuating resistivity changes caused by noise in the process system, and attenuating resistivity changes to a higher degree when the confidence measure is low and attenuating resistivity changes to a lower degree when the confidence measure is high, and
   the confidence measure in step e) is calculated in accordance with formula (2)

$$\text{confidence} = (L - \text{Abs}(R_t - R_a))/L \qquad (2),$$

where confidence represents calculated confidence with decimal values from ranging from 0 to 1, where the value 0 represents no or low confidence, and the value 1 represents high confidence, $R_t$ represents the latest reference resistance value from a selected range of measurements, $R_a$ represents a weighted average of resistance samples taken at previous points in time, and L represents a noise limit value.

2. The method of claim 1, characterized in that the method further comprises the step:
   g) triggering an alarm if the trustworthy value for real metal loss exceeds a predetermined threshold value.

3. Method of measuring metal loss from equipment in process systems in contact with erosive and/or corrosive process fluids, including pipelines and fittings in gas and oil wells exposed to fluids flowing from downhole formations, wherein the method comprises the steps of:
- a) providing a monitoring probe in contact with the process fluids, said probe comprising one or more measurement elements exposed to the flow of the process fluids, and a reference element protected from flow of the process fluids,
- b) measuring electrical resistance e across said one or more measurement elements,
- c) measuring electrical resistance Re across the reference element,
- d) calculating the metal loss $\Delta h_e$ from the resistivity measured in accordance with the formula $$\Delta h_e = h_e - h_r \cdot (R_r/R_e) \qquad (1),$$

where $\Delta h_e$, $R_r$ and $R_e$ are as defined above and $h_e$ and $h_r$ represents the original thickness of said at least one measurement element and the reference element, respectively, characterized in that
- e) providing a confidence measure of change in resistivity observed, by calculating the stability of the reference element resistance value or stability of temperature of the probe measured by an additional temperature sensor,
- f) applying the confidence measure from step e) in a comparison of resistivity changes as a function of time, to provide a trustworthy value for real metal loss in said one or more measurement elements, thus attenuating resistivity changes caused by noise in the process system, and attenuating resistivity changes to a higher degree when the confidence measure is low and attenuating resistivity changes to a lower degree when the confidence measure is high, and in step f) the trustworthy value for real metal loss is calculated in accordance with formula (3):

$$Y_t = X_t \cdot \text{confidence} + Y_{t-1} \cdot (1 - \text{confidence}) \qquad (3)$$

where the calculated output value $Y_t$ is filtered resistance ratio between the measurement element and the reference element at a point in time t, representing trusted metal loss, the input value $X_t$ is unfiltered resistance ratio between the measurement element and the reference element at a point in time t, representing untrusted metal loss, the input value $Y_{t-1}$ represents calculated filtered resistance ratio between the measurement element and the reference element at a previous point in time t−1, and the input value confidence represents the confidence measure calculated in step e).

4. The method of claim 3, characterized in that the time difference between observed resistivity taken at time "t" and "t−1" has an order of magnitude of minute for sand probes.

5. The method of claim 3, characterized in that the time difference between observed resistivity taken at time "t" and "t−1" has an order of magnitude of hours or days for corrosion probes.

6. The method of claim 3, characterized in that the method further comprises the step:
- g) triggering an alarm if the trustworthy value for real metal loss exceeds a predetermined threshold value.

7. The method of claim 3, wherein the confidence measure in step e) is calculated in accordance with formula (2)

$$\text{confidence} = (L - \text{Abs}(R_t - R_a))/L \qquad (2),$$

where confidence represents calculated confidence with decimal values from ranging from 0 to 1, where the value 0 represents no or low confidence, and the value 1 represents high confidence, $R_t$ represents the latest reference resistance value from a selected range of measurements, $R_a$ represents a weighted average of resistance samples taken at previous points in time, and L represents a noise limit value.

8. Method of measuring metal loss from equipment in process systems in contact with one or both of erosive and corrosive process fluids, including pipelines and fittings in gas and oil wells exposed to fluids flowing from downhole formations, wherein the method comprises the steps of:
- a) providing a monitoring probe in contact with the process fluids, said probe comprising one or more measurement elements exposed to the flow of the process fluids, and a reference element protected from flow of the process fluids,
- b) measuring electrical resistance e across said one or more measurement elements,
- c) measuring electrical resistance Re across the reference element,
- d) calculating the metal loss $\Delta h_e$ from the resistivity measured in accordance with the formula $$\Delta h_e = h_e - h_r \cdot (R_r/R_e) \qquad (1),$$

where $\Delta h_e$, $R_r$, and $R_e$ are as defined above and $h_e$ and $h_r$ represents the original thickness of said at least one measurement element and the reference element, respectively, characterized in that
- e) providing a confidence measure of change in resistivity observed, by calculating the stability of the reference element resistance value or stability of temperature of the probe measured by an additional temperature sensor,
- f) applying the confidence measure from step e) in a comparison of resistivity changes as a function of time, to provide a trustworthy value for real metal loss in said one or more measurement elements, thus attenuating resistivity changes caused by noise in the process system, and attenuating resistivity changes to a higher degree when the confidence measure is low and attenuating resistivity changes to a lower degree when the confidence measure is high, and in step f) the trustworthy value for real metal loss is calculated in accordance with formula (3):

$$Y_t = X_t \cdot \text{confidence} + Y_{t-1} \cdot (1 - \text{confidence}) \qquad (3)$$

where the calculated output value $Y_t$ is a filtered resistance measurement of the measurement element at a point in time t, representing trusted metal loss, the input value $X_t$ is unfiltered resistance measurement of the measurement element at a point in time t, representing untrusted metal loss, the input value $Y_{t-1}$ represents calculated filtered resistance measurement of measurement element at a previous point in time t−1, and the input value confidence represents the confidence measure calculated in step e), repeating the calculation above, where $X_t$ represents unfiltered resistance the measurement for reference element, $Y_{t-1}$ represents calculated filtered resistance for the reference element at a previous point in time t−1, wherein the input value confidence is as defined above, and then calculating the ratio between filtered resistance values $Y_t$ for resistance values for the measurement element and the reference element, respectively, at selected points in time t.

9. The method of claim 8, characterized in that the time difference between observed resistivity taken at time "t" and "t−1" has an order of magnitude of minute for sand probes.

10. The method of claim 8, characterized in that the time difference between observed resistivity taken at time "t" and "t−1" has an order of magnitude of hours or days for corrosion probes.

11. The method of claim 8, wherein the confidence measure in step e) is calculated in accordance with formula (2)

$$\text{confidence} = (L - \text{Abs}(R_t - R_a))/L \qquad (2),$$

where confidence represents calculated confidence with decimal values from ranging from 0 to 1, where the value 0 represents no or low confidence, and the value 1 represents high confidence, $R_t$ represents the latest reference resistance value from a selected range of measurements, $R_a$ represents a weighted average of resistance samples taken at previous points in time, and L represents a noise limit value.

\* \* \* \* \*